US012796397B2

(12) United States Patent
Morioka

(10) Patent No.: US 12,796,397 B2
(45) Date of Patent: Nov. 10, 2026

(54) WAFER PLACEMENT TABLE AND METHOD OF USING THE SAME

(71) Applicant: NGK INSULATORS, LTD., Nagoya-City (JP)

(72) Inventor: Ikuhisa Morioka, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 216 days.

(21) Appl. No.: 18/667,048

(22) Filed: May 17, 2024

(65) Prior Publication Data

US 2025/0079230 A1 Mar. 6, 2025

Related U.S. Application Data

(63) Continuation of application No. PCT/JP2023/031260, filed on Aug. 29, 2023.

(51) Int. Cl.

*H10P 72/76* (2026.01)
*H01J 37/32* (2006.01)

(Continued)

(52) U.S. Cl.

CPC .... *H10P 72/7616* (2026.01); *H01J 37/32724* (2013.01); *H10P 72/0432* (2026.01);

(Continued)

(58) Field of Classification Search

CPC ..... H01L 21/687; H01L 21/67; H01L 21/683; H01L 21/68757; H01L 21/67103;

(Continued)

(56) References Cited

U.S. PATENT DOCUMENTS

| | | | |
|---|---|---|---|
| 2006/0076108 | A1 | 4/2006 | Holland et al. |
| 2011/0096460 | A1 | 4/2011 | Yonekura et al. |

(Continued)

FOREIGN PATENT DOCUMENTS

| | | |
|---|---|---|
| JP | 2006-140455 A | 6/2006 |
| JP | 2011-091297 A | 5/2011 |

(Continued)

OTHER PUBLICATIONS

International Search Report and Written Opinion (Application No. PCT/JP2023/031260) dated Nov. 14, 2023 (8 pages).

(Continued)

*Primary Examiner* — Danny Nguyen

(74) *Attorney, Agent, or Firm* — Muncy, Geissler, Olds & Lowe, P.C.

(57) ABSTRACT

The wafer placement table includes a ceramic plate, a thermal diffusion plate, a first adhesive layer, a cooling plate, and a second adhesive layer. The ceramic plate has a wafer placement surface on its upper surface, and includes built-in electrodes. The thermal diffusion plate is provided on the lower surface of the ceramic plate. The first adhesive layer bonds the ceramic plate and the thermal diffusion plate together. The cooling plate is provided on the lower surface of the thermal diffusion plate, and internally includes a refrigerant flow path. The second adhesive layer is provided between the thermal diffusion plate and the cooling plate. The second adhesive layer is provided with an adhesive part and a hollow part, the adhesive part bonding the thermal diffusion plate and the cooling plate together, the hollow part being a gap provided between the thermal diffusion plate and the cooling plate.

17 Claims, 6 Drawing Sheets

(51) Int. Cl.
*H10P 72/00* (2026.01)
*H10P 72/72* (2026.01)

(52) U.S. Cl.
CPC ...... *H10P 72/0434* (2026.01); *H10P 72/0602* (2026.01); *H10P 72/722* (2026.01); *H01J 2237/3321* (2013.01); *H01J 2237/334* (2013.01)

(58) Field of Classification Search
CPC ............ H01L 21/67248; H01L 21/6833; H01J 37/32; H01J 37/32724; H01J 2237/3321; H10P 72/0432; H10P 72/0434; H10P 72/722; H10P 72/72
USPC .......................................................... 361/234
See application file for complete search history.

(56) References Cited

U.S. PATENT DOCUMENTS

| | | | | |
|---|---|---|---|---|
| 2014/0099485 | A1 | 4/2014 | Narendrnath et al. | |
| 2015/0043122 | A1 | 2/2015 | Eto et al. | |
| 2016/0035610 | A1* | 2/2016 | Park | H10P 72/722 165/80.2 |
| 2018/0374737 | A1 | 12/2018 | Margavio | |
| 2021/0066107 | A1* | 3/2021 | Zhang | H10P 72/0434 |
| 2024/0282612 | A1* | 8/2024 | Miyazaki | H10P 72/722 |
| 2024/0297026 | A1* | 9/2024 | Sunohara | H01J 37/32724 |

FOREIGN PATENT DOCUMENTS

| | | | |
|---|---|---|---|
| JP | 2015-035485 | A | 2/2015 |
| JP | 2016-136552 | A | 7/2016 |
| JP | 2017-147312 | A | 8/2017 |
| JP | 2018-137480 | A | 8/2018 |
| JP | 2020-526012 | A | 8/2020 |
| JP | 2022-175819 | A | 11/2022 |

OTHER PUBLICATIONS

English translation of the International Preliminary Report on Patentability (Chapter I) (Application No. PCT/JP2023/031260) mailed Mar. 12, 2026 (6 pages).

* cited by examiner

WAFER PLACEMENT TABLE AND METHOD OF USING THE SAME

BACKGROUND OF THE INVENTION

1. Field of the Invention

The present invention relates to a wafer placement table and a method of using the wafer placement table.

2. Description of the Related Art

Conventionally, members for semiconductor manufacturing apparatus have been known which include: a ceramic plate having a wafer placement surface on its upper surface and a built-in electrode; and a cooling plate that is provided on the lower surface of the ceramic plate, and internally includes a refrigerant flow path. PTL 1 states that in this type of wafer placement table, a cylindrical recess is formed on the upper surface of the cooling plate, and a heat transfer gas such as He is introduced into a gap (hollow part) formed by the recess with the ceramic plate placed on the cooling plate. It is also stated that when a wafer is etched, a high thermal resistance between the ceramic plate and the cooling plate causes the temperature of the ceramic plate to increase, which makes it difficult to achieve an intended temperature, and in order to solve this, the pressure of the heat transfer gas supplied to the hollow part is adjusted.

CITATION LIST

Patent Literature

PTL 1: JP 2016-136552 A

SUMMARY OF THE INVENTION

However, in PTL 1, a recess needs to be formed on the upper surface of the cooling plate, thus the manufacturing process for the wafer placement table is complicated. In addition, of the ceramic plate, an upper portion of the recess and an upper portion of the outer edge part of the recess are likely to a temperature difference therebetween, thus thermal stress is likely to be applied to the ceramic plate.

The present invention has been devised to solve such a problem, and it is a main object to facilitate the production of a hollow part between the ceramic plate and the cooling plate and inhibit thermal stress from being applied to the ceramic plate.

[1] A wafer placement table of the present invention includes: a ceramic plate having a wafer placement surface on its upper surface and a built-in electrode; a thermal diffusion plate provided on a lower surface of the ceramic plate; a first adhesive layer bonding the ceramic plate and the thermal diffusion plate together; a cooling plate that is provided on a lower surface of the thermal diffusion plate, and internally includes a refrigerant flow path; and a second adhesive layer provided between the thermal diffusion plate and the cooling plate, and having an adhesive part and a hollow part, the adhesive part bonding the thermal diffusion plate and the cooling plate together, the hollow part being a gap provided between the thermal diffusion plate and the cooling plate.

The wafer placement table includes the second adhesive layer provided with the adhesive part and the hollow part. Since the second adhesive layer is provided with the hollow part in this manner, it is not necessary to form a recess (hollow part) in the upper surface of the cooling plate as in a conventional manner, and the hollow part can be easily produced. In addition, there is a difference in thermal resistance in an up-down direction between the adhesive part and the hollow part of the second adhesive layer, thus a temperature difference between the area immediately above the adhesive part and the area immediately above the hollow part of the ceramic plate is likely to occur, but herein, a thermal diffusion plate is disposed on the upper surface of the second adhesive layer. Due to the presence of the thermal diffusion plate, the temperature difference between the area immediately above the adhesive part and the area immediately above the hollow part of the ceramic plate is reduced. Therefore, thermal stress is unlikely to be applied to the ceramic plate.

Note that in the present specification, the present invention is described using the upper and lower, the right and left, the front and back, however, the upper and lower, the right and left, the front and back indicate only a relative positional relationship. Thus, when the orientation of the wafer placement table is changed, the upper and lower may become the right and left, or the right and left may become the upper and lower, and such a case is also included in the technical scope of the present invention.

[2] In the wafer placement table (the wafer placement table according to [1]) of the present invention, the cooling plate may include a communication path that communicates with the hollow part from a lower surface or a lateral surface of the cooling plate. In this setting, the hollow part can be switched between high and low thermal conductivity states via e.g., a communication path. For example, when the wafer is desired to be efficiently cooled (such as when a wafer is processed by plasma), the hollow part is set to a high thermal conductivity state to promote cooling of the wafer by the refrigerant. When the wafer is not desired to be cooled (such as when plasma is not generated), the hollow part is set to a low thermal conductivity state to inhibit cooling of the wafer by the refrigerant. For example, when a heat transfer gas such as He gas is filled in the hollow part, the hollow part can be set to a high thermal conductivity state, and when the hollow part is vacuumized, the hollow part can be set to a low thermal conductivity state.

[3] In the wafer placement table (the wafer placement table according to [1] or [2]) of the present invention, a thickness of the thermal diffusion plate is greater than a thickness between a ceiling surface of the refrigerant flow path of the cooling plate and an upper surface of the cooling plate. In this setting, thermal diffusion in a horizontal direction in the thermal diffusion plate can be performed sufficiently, thus the temperature difference between the area immediately above the adhesive part and the area immediately above the hollow part of the ceramic plate is likely to be reduced.

[4] In the wafer placement table (the wafer placement table according to any one of [1] to [3]) of the present invention, a thermal conductivity of the thermal diffusion plate may be higher than a thermal conductivity between a ceiling surface of the refrigerant flow path of the cooling plate and an upper surface of the cooling plate. In this setting, thermal diffusion in a horizontal direction in the thermal diffusion plate can be performed sufficiently, thus the temperature difference between the area immediately above the adhesive part and the area immediately above the hollow part of the ceramic plate is likely to be reduced.

[5] In the wafer placement table (the wafer placement table according to any one of [1] to [4]) of the present invention, a thickness of the first adhesive layer may be less than a thickness of the second adhesive layer. In this setting, when the thermal conductivity of the hollow part of the second adhesive layer is changed, it is possible to reduce interference by the first adhesive layer on the effect of the change.

[6] In the wafer placement table (the wafer placement table according to any one of [1] to [5]) of the present invention, a thermal resistance of the first adhesive layer in an up-down direction may be lower than a thermal resistance of the adhesive part of the second adhesive layer in an up-down direction. In this setting, when the thermal conductivity of the hollow part of the second adhesive layer is changed, it is possible to reduce interference by the first adhesive layer on the effect of the change.

[7] In the wafer placement table (the wafer placement table according to any one of [1] to [6]) of the present invention, a ratio of a bonding area of the adhesive part with respect to an entire area of the second adhesive layer in a plan view may be 10% or greater and 50% or less. When the ratio is greater than or equal to 10%, the thermal diffusion plate and the cooling plate can be bonded together with sufficient strength. When the ratio is less than or equal to 50%, the occupancy of the hollow part in the second adhesive layer is sufficiently high, thus the difference in cooling ability by the refrigerant between high and low thermal conductivity states of the hollow part can be sufficiently increased.

[8] In the wafer placement table (the wafer placement table according to any one of [1] to [7]) of the present invention, the hollow part may be switchable between high and low thermal conductivity states.

[9] In a method of using the wafer placement table (the wafer placement table according to [1] or [2]) of the present invention, when cooling of a wafer placed on the wafer placement surface is desired to be promoted, the hollow part may be set to a high thermal conductivity state, and when cooling of the wafer placed on the wafer placement surface is desired to be inhibited, the hollow part may be set to a low thermal conductivity state. When the hollow part is set to a low thermal conductivity state, the second adhesive layer inhibits transfer of heat between the thermal diffusion plate and the cooling plate, as compared to when the hollow part is set to a high thermal conductivity state. Thus, when the hollow part is set to a high thermal conductivity state, cooling of the wafer by the refrigerant can be promoted, and when the hollow part is set to a low thermal conductivity state, cooling of the wafer by the refrigerant can be inhibited.

In the method of using the wafer placement table (the method of using the wafer placement table according to [9]) of the present invention, when cooling of a wafer placed on the wafer placement surface is desired to be promoted, the hollow part may be set to a high thermal conductivity state by filling the hollow part with a heat transfer gas, and when cooling of the wafer placed on the wafer placement surface is desired to be inhibited, the hollow part may be set to a low thermal conductivity state by bringing the hollow part to a vacuum state.

BRIEF DESCRIPTION OF THE DRAWINGS

FIG. 4 is an explanatory view illustrating a use example of a wafer placement table 10 when plasma is ON.

DETAILED DESCRIPTION OF THE INVENTION

Figure 1:
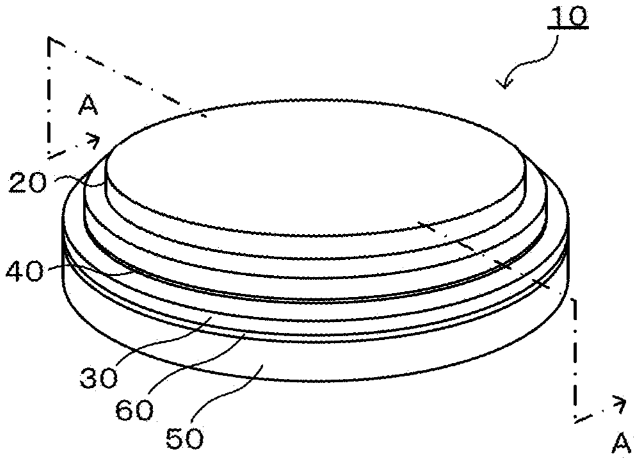
FIG. 1 is a perspective view of a wafer placement table 10.
Figure 2:
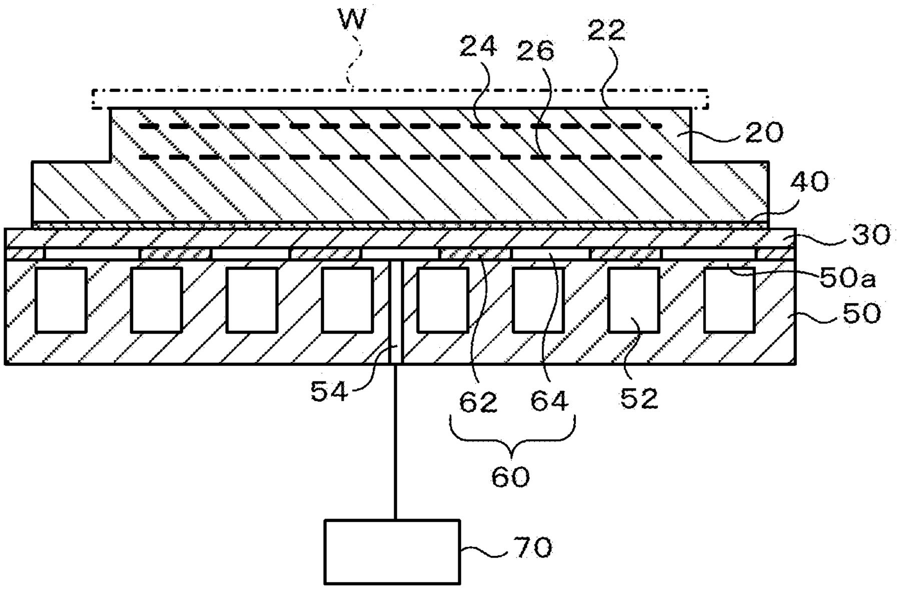
FIG. 2 is an A-A cross-sectional view of FIG. 1.
Figure 3:
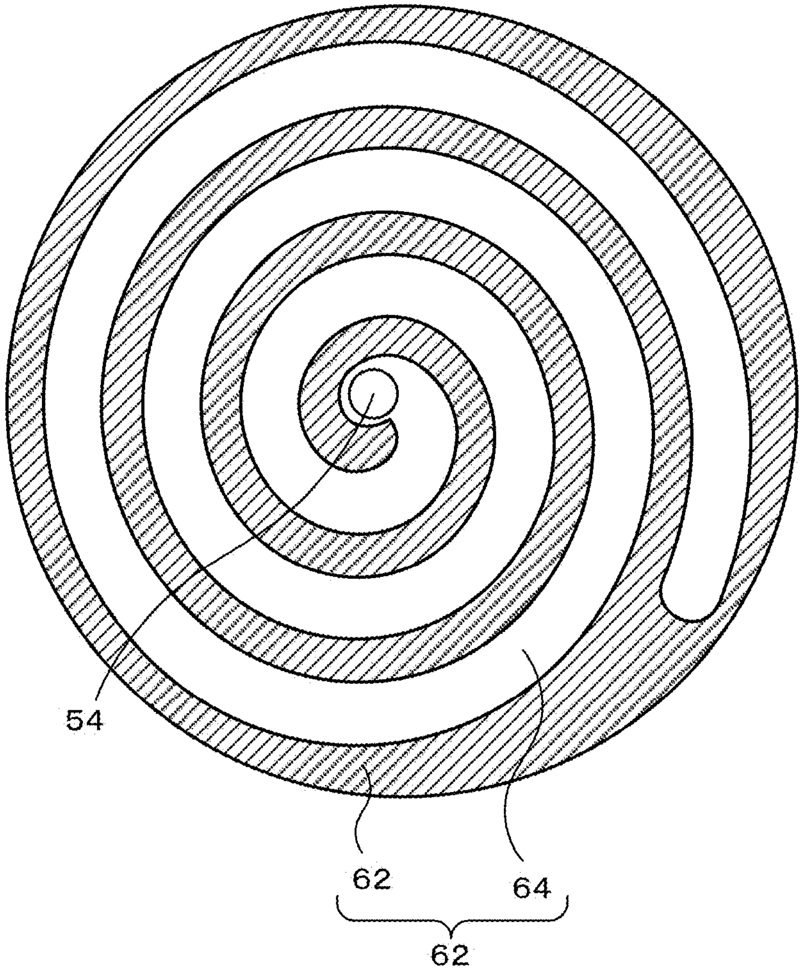
FIG. 3 is a top view of a cross sectional view when a second adhesive layer 60 is cut horizontally.

Next, a preferred embodiment of the present invention will be described using the drawings. FIG. 1 is a perspective view of a wafer placement table 10, FIG. 2 is an A-A cross-sectional view of FIG. 1, and FIG. 3 is a top view of a cross sectional view when a second adhesive layer 60 of the wafer placement table 10 is cut horizontally.

The wafer placement table 10 is used to perform CVD and etching on the wafer W by utilizing plasma. The wafer placement table 10 includes a ceramic plate 20, a thermal diffusion plate 30, a first adhesive layer 40, a cooling plate 50, and a second adhesive layer 60.

The ceramic plate 20 is a circular disc member having a step along the outer circumference. The ceramic plate 20 is made of a ceramic material represented by alumina, aluminum nitride or the like, and has a circular wafer placement surface 22 on the upper surface. The wafer W is placed on the wafer placement surface 22. On the wafer placement surface 22, a seal band which is not illustrated is formed along the outer edge of the upper surface of the ceramic plate 20, and a plurality of small flat circular projections are formed on the entire surface inside the seal band. The seal band and the small circular projections have the same height which is e.g., several μm to several 10 μm. An electrostatic electrode 24 and a heater electrode 26 are embedded in the ceramic plate 20.

The electrostatic electrode 24 is a planar mesh electrode embedded in a region corresponding to substantially the entire upper surface of the ceramic plate 20, and a direct-current voltage is applicable to the electrostatic electrode 24. When a direct-current voltage is applied to the electrostatic electrode 24, the wafer W is attracted and fixed to the wafer placement surface 22 (specifically, the upper surface of the seal band and the upper surface of the small circular projections) by an electrostatic attraction force, and when application of the direct-current voltage is released, the attraction and fixing of the wafer W to the wafer placement surface 22 is released. The electrostatic electrode 24 is also coupled to a radio frequency (RF) power supply. The heater electrode 26 is a resistance heating element formed from one end to the other end in a one-stroke pattern in a region corresponding to substantially the entire upper surface of the ceramic plate 20. The heater electrode 26 can receive supply of electric power from a heater power supply which is not illustrated.

The thermal diffusion plate 30 is provided on the lower surface of the ceramic plate 20. Specifically, the thermal diffusion plate 30 is bonded to the lower surface of the ceramic plate 20 via the first adhesive layer 40. The thermal diffusion plate 30 is a solid circular disc member made of metal represented by aluminum, aluminum alloy or the like. The thickness of the thermal diffusion plate 30 is greater than the thickness of a cooling plate upper layer **50*a* mentioned later, and is preferably, 1 to 10 mm, e.g., 3 mm. The thermal conductivity of the thermal diffusion plate 30** is preferably 50 to 300 W/mK, e.g., 180 W/mK.

In this embodiment, the first adhesive layer 40 is a circular solid resin adhesive layer. The resin adhesive layer is obtained, for example, by inserting an adhesive sheet with both sides coated with an organic adhesive agent between the lower surface of the ceramic plate 20 and the upper surface of the thermal diffusion plate 30, and hardening the adhesive sheet. The thickness of the first adhesive layer 40 is preferably 0.01 to 1 mm, e.g., 0.075 mm. The thermal conductivity of the first adhesive layer 40 is preferably 0.1 to 5 W/mK, e.g., 0.2 W/mK. As the resin for the resin adhesive layer, a resin such as acrylic resin, silicone resin, epoxy resin may be used. A filler may be contained in the resin.

The cooling plate 50 is provided on the lower surface of the thermal diffusion plate 30. Specifically, the cooling plate 50 is bonded to the lower surface of the thermal diffusion plate 30 via the second adhesive layer 60. The cooling plate 50 is a circular disc member made of metal represented by aluminum, aluminum alloy or the like. The cooling plate 50 may be made of the same material as that of the thermal diffusion plate 30. The cooling plate 50 internally includes a refrigerant flow path 52 through which refrigerant can be circulated. The refrigerant flow path 52 is formed from one end (inlet) to the other end (outlet) in a one-stroke pattern in a region corresponding to substantially the entire upper surface of the ceramic plate 20. The refrigerant flow path 52 may be formed, for example, in a swirl shape, or formed in a zigzag shape in a plan view. The refrigerant is supplied from a refrigerant circulation device (not illustrated) to one end (inlet) of the refrigerant flow path 52, passed through the refrigerant flow path 52, discharged from the other end (outlet) of the refrigerant flow path 52, and is returned to the refrigerant circulation device. The refrigerant circulation device can adjust the refrigerant to a desired temperature. The refrigerant is preferably liquid, and preferably liquid having electrical insulating properties. As liquid having electrical insulating properties, e.g., fluorine-based inert liquid may be mentioned. The thermal conductivity of the cooling plate 50 is preferably 50 to 300 W/mK, e.g., 180 W/mK.

Of the cooling plate 50, the part between the ceiling surface of the refrigerant flow path 52 and the upper surface of the cooling plate 50 is referred to as a cooling plate upper layer 50*a*. The thickness of the cooling plate upper layer 50*a* is less than the thickness of the thermal diffusion plate 30, preferably 0.5 to 5 mm, e.g., 1 mm. The thermal conductivity of the cooling plate upper layer 50*a* is the same as the thermal conductivity of the cooling plate 50. The thermal conductivities of both may be different.

The second adhesive layer 60 is a resin adhesive layer provided between the lower surface of the thermal diffusion plate 30 and the upper surface of the cooling plate 50. The resin adhesive layer is obtained, for example, by inserting an adhesive sheet with both sides coated with an organic adhesive agent between the lower surface of the thermal diffusion plate 30 and the upper surface of the cooling plate 50, and hardening the adhesive sheet. The second adhesive layer 60 is provided with an adhesive part 62 and a hollow part 64, the adhesive part 62 bonding the thermal diffusion plate 30 and the cooling plate 50 together, the hollow part 64 being a gap provided between the thermal diffusion plate 30 and the cooling plate 50. Specifically, the adhesive part 62 and the hollow part 64 are provided in the planar direction of the second adhesive layer 60. In the embodiment illustrated in FIG. 3, the second adhesive layer 60 is obtained by punching out a swirl passage from a circular adhesive sheet having the same outer diameter as the diameter of the thermal diffusion plate 30, and the swirl passage serves as the hollow part 64, and the portion other than the swirl passage serves as the adhesive part 62. In order to form the hollow part 64, the adhesive sheet with the swirl passage punched out may be disposed between the thermal diffusion plate 30 and the cooling plate 50. Thus, the hollow part 64 can be easily formed, as compared to when a recess is formed in the upper surface of the cooling plate 50 as in a conventional manner. As the resin for the resin adhesive layer, a resin such as acrylic resin, silicone resin, epoxy resin may be used. A filler may be contained in the resin.

The thickness of the second adhesive layer 60 (adhesive part 62) is greater than the thickness of the first adhesive layer 40. In other words, the thickness of the first adhesive layer 40 is less than the thickness of the second adhesive layer 60. The thermal resistance of the adhesive part 62 in an up-down direction in the second adhesive layer 60 is greater than the thermal resistance in an up-down direction in the first adhesive layer 40. In other words, the thermal resistance of the first adhesive layer 40 in an up-down direction is less than the thermal resistance of the adhesive part 62 in an up-down direction. Let R ($m^2 \cdot K/W$) be the thermal resistance, t (m) be the thickness, A (W/mK) be the thermal conductivity, then R=t/A. Thus, for example, when the first adhesive layer 40 and the adhesive part 62 are made of materials with the same thermal conductivity, the thermal resistance of the first adhesive layer 40 in an up-down direction is made less than the thermal resistance of the adhesive part 62 in an up-down direction by setting the thickness of the first adhesive layer 40 to a value less than the thickness of the adhesive part 62. The thickness of the second adhesive layer 60 is preferably 0.05 to 2 mm, e.g., 0.125 mm. The thermal conductivity (same as the thermal conductivity of the adhesive part 62) of the second adhesive layer 60 is preferably 0.1 to 2 W/mK, e.g., 0.2 W/mK. The thermal resistance of the adhesive part in an up-down direction in the second adhesive layer 60 is preferably 0.025 to 20 $m^2 \cdot K/W$. In contrast, the thermal resistance of the first adhesive layer 40 in an uo-down direction is preferably 0.002 to 10 $m^2 \cdot K/W$.

The ratio of the bonding area of the adhesive part 62 with respect to the entire area (the area of the adhesive part 62 and the hollow part 64 combined together, which is the same as the area of the lower surface of the thermal diffusion plate 30 herein) of the second adhesive layer 60 in a plan view is preferably 10% or greater and 50% or less.

The cooling plate 50 is provided with a communication path 54 which communicates with the hollow part 64. The communication path 54 penetrates the cooling plate 50 in an up-down direction, and is open to the lower surface of the cooling plate 50. The hollow part 64 is coupled to a fluid switching mechanism 70 via the communication path 54. The fluid switching mechanism 70 can switch between supply and discharge of fluid to and from the hollow part 64. After discharging the gas in the hollow part 64 through the communication path 54, the fluid switching mechanism 70 closes the hollow part 64, thereby creating a vacuum atmosphere (a low thermal conductivity state) in the hollow part 64, or after introducing a heat transfer gas such as He gas (with a thermal conductivity of 0.2 W/m·K) into the hollow part 64 in a vacuum atmosphere, the fluid switching mechanism 70 closes the hollow part 64, thereby achieving a high thermal conductivity state of the hollow part 64. The communication path 54 is not limited to the form of FIG. 2, and may be open to the lateral surface of the cooling plate 50.

Next, a use example of the wafer placement table 10 will be described. The wafer placement table 10 is fixed to the inside of a chamber (not illustrated) for semiconductor process. The wafer W is placed on the wafer placement surface 22. In this state, a direct-current voltage is applied to the electrostatic electrode 24 to cause the wafer W to be attracted to the wafer placement surface 22. Along with this, refrigerant is circulated through the refrigerant flow path 52. In addition, electric power is supplied to the heater electrode 26 to cause the heater electrode 26 to generate heat to heat the wafer W. The inside of the chamber is set to create a predetermined vacuum atmosphere, and an RF voltage is applied to the electrostatic electrode 24 while process gas is being supplied from a shower head provided on the ceiling of the chamber. Then plasma is generated between the wafer W and the shower head. CVD film formation is performed or etching is performed on the wafer W by utilizing the plasma. Whether a high thermal conductivity state is achieved by sealing the heat transfer gas in the hollow part 64 or a low thermal conductivity state is achieved by creating a vacuum atmosphere in the hollow part 64 is switched as needed according to the situation.

Figure 4:
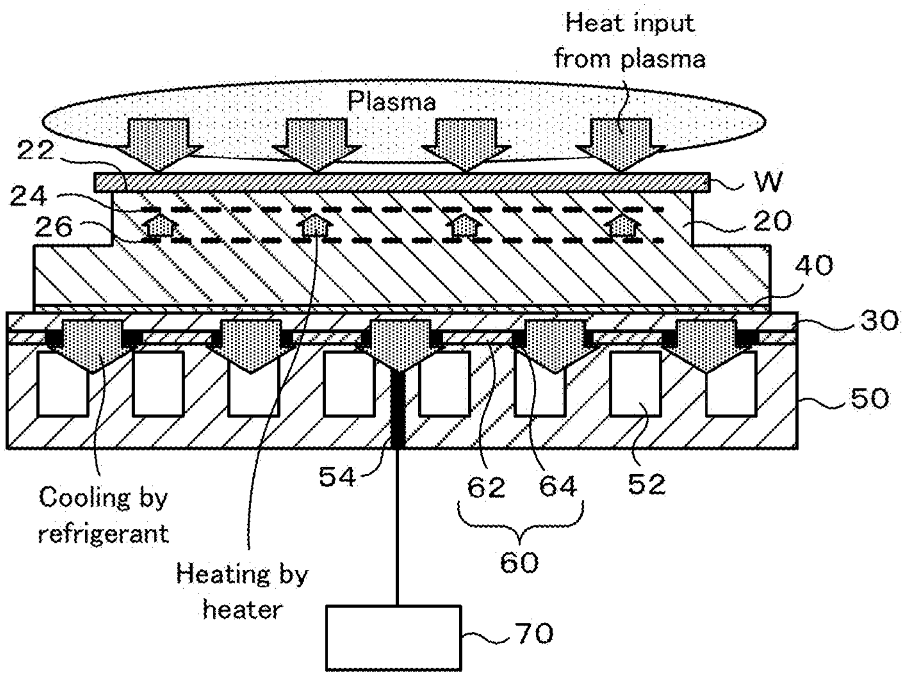

For example, when plasma is generated above the wafer Was illustrated in FIG. 4 (when plasma is ON), the wafer W receives heat input from the plasma. Thus, this situation corresponds to the case (the case where desired level for cooling is high) where cooling of the wafer W placed on the wafer placement surface 22 is desired to be promoted. In this case, cooling needs to be performed by the refrigerant flowing through the refrigerant flow path 52 so that the temperature of the wafer W reaches a predetermined temperature. Thus, the fluid switching mechanism 70 is adjusted so that a heat transfer gas is sealed in the hollow part 64. Consequently, the thermal conductivity between the thermal diffusion plate 30 and the cooling plate 50 is increased (the thermal resistance in an up-down direction is decreased), thus the wafer W can be smoothly cooled. When the temperature of the wafer W falls below a predetermined temperature, adjustment is made by the heater electrode 26 so that the temperature of the wafer W reaches the predetermined temperature.

Figure 5:
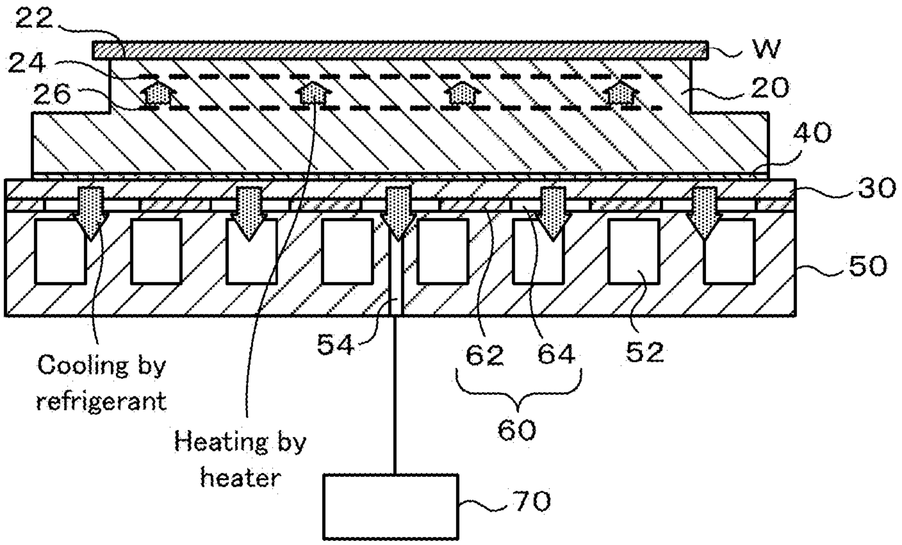
FIG. 5 is an explanatory view illustrating a use example of the wafer placement table 10 when plasma is OFF.

In contrast, when plasma is not generated as illustrated in FIG. 5 (when plasma is OFF), the wafer W receives no heat input from the plasma. Thus, this situation corresponds to the case (the case where desired level for cooling is low) where cooling of the wafer W placed on the wafer placement surface 22 is desired to be inhibited. In this case, there is not much need for cooling by the refrigerant flowing through the refrigerant flow path 52 so that the temperature of the wafer W reaches a predetermined temperature. Thus, the fluid switching mechanism 70 is adjusted so that a vacuum atmosphere is created in the hollow part 64. Consequently, the thermal conductivity between the thermal diffusion plate 30 and the cooling plate 50 is decreased (the thermal resistance in an up-down direction is increased), thus the temperature of the wafer W does not decrease excessively by the refrigerant. Also in this case, fine adjustment is made by the heater electrode 26 so that the temperature of the wafer W reaches a predetermined temperature; however, the amount of heat generated by the heater electrode 26 is less, as compared to when a solid adhesive layer is provided instead of the second adhesive layer 60. The amount of heat generated by the heater electrode 26 is at approximately the same level as in the case where plasma is generated. In this case, the thermal conductivity of the adhesive part 62 is significantly different from the thermal conductivity of the hollow part 64 in a vacuum atmosphere, thus even though a temperature difference between the area immediately above the adhesive part 62 and the area immediately above the hollow part 64 of the ceramic plate 20 is likely to occur normally, such a temperature difference can be prevented from occurring in the ceramic plate because the thermal diffusion plate 30 is disposed on the lower surface of the ceramic plate 20 herein.

The wafer placement table 10 described above includes the second adhesive layer 60 provided with the adhesive part 62 and the hollow part 64. Since the second adhesive layer 60 is provided with the hollow part 64 in this manner, the hollow part 64 can be easily produced, as compared to when a recess (hollow part) is formed in the upper surface of the cooling plate 50. Because there is a difference in thermal conductivity between the adhesive part 62 and the hollow part 64 of the second adhesive layer 60, the temperature difference between the area immediately above the adhesive part 62 and the area immediately above the hollow part 64 of the ceramic plate 20 is likely to occur, but herein, the thermal diffusion plate 30 is disposed on the upper surface of the second adhesive layer 60. Due to the presence of the thermal diffusion plate 30, the temperature difference between the area immediately above the adhesive part 62 and the area immediately above the hollow part 64 of the ceramic plate 20 is reduced. Therefore, thermal stress is unlikely to be applied to the ceramic plate 20.

The wafer placement table 10 includes the communication path 54 which communicates with the hollow part 64 from the lower surface of the cooling plate 50. Thus, the hollow part 64 can be switched between high and low thermal conductivity states via the communication path 54. For example, when the wafer W is desired to be efficiently cooled (such as when the wafer W is treated by plasma), the hollow part 64 is set to a high thermal conductivity state to promote cooling of the wafer W by the refrigerant. When the wafer W is not desired to be cooled (such as when plasma is not generated), the hollow part 64 is set to a low thermal conductivity state to inhibit cooling of the wafer W by the refrigerant. For example, when a heat transfer gas such as He gas is filled in the hollow part 64, the hollow part 64 can be set to a high thermal conductivity state, and when the hollow part 64 is set to a vacuum atmosphere, the hollow part 64 can be set to a low thermal conductivity state.

Furthermore, the thickness of the thermal diffusion plate 30 is greater than the thickness of the cooling plate upper layer 50*a*. Consequently, thermal diffusion in a horizontal direction in the thermal diffusion plate 30 can be performed sufficiently, thus the temperature difference between the area immediately above the adhesive part 62 and the area immediately above the hollow part 64 of the ceramic plate 20 is likely to be reduced.

Furthermore, the thermal conductivity of the thermal diffusion plate 30 is higher than the thermal conductivity of the cooling plate upper layer 50*a*. Consequently, thermal diffusion in a horizontal direction in the thermal diffusion plate 30 can be performed sufficiently, thus the temperature difference between the area immediately above the adhesive part 62 and the area immediately above the hollow part 64 of the ceramic plate 20 is likely to be reduced.

The thickness of the first adhesive layer 40 is less than the thickness of the second adhesive layer 60. Thus, when the thermal conductivity of the hollow part 64 of the second adhesive layer 60 is changed, it is possible to reduce interference by the first adhesive layer 40 on the effect of the change.

The thermal resistance of the first adhesive layer 40 in an up-down direction is lower than the thermal resistance of the adhesive part 62 in an up-down direction in the second adhesive layer 60. Thus, when the thermal conductivity of the hollow part 64 of the second adhesive layer 60 is changed, it is possible to reduce interference by the first adhesive layer 40 on the effect of the change. The ratio of the total bonding area of a plurality of adhesive parts 62 with respect to the entire area (which is the same as the area of the lower surface of the thermal diffusion plate 30 herein) of the second adhesive layer 60 in a plan view is preferably 10% or greater and 50% or less. When the ratio is greater than or equal to 10%, the thermal diffusion plate 30 and the cooling plate 50 can be bonded together with sufficient strength. When the ratio is less than or equal to 50%, the occupancy of the hollow part 64 in the second adhesive layer 60 is sufficiently high, thus the difference in cooling ability by the refrigerant between high and low thermal conductivity states of the hollow part 64 can be sufficiently increased.

Besides, the second adhesive layer 60 includes the adhesive part 62 in addition to the hollow part 64, thus the adhesive part 62 serves as a columnar support, and when the entirety of the hollow parts 64 is viewed, variation in the heights of the hollow parts is unlikely to occur. In contrast, in PTL 1, the hollow parts are not provided with a columnar support, thus when the entirety of the hollow parts 64 is viewed, variation in the heights of the hollow parts is likely to occur.

In addition, when cooling of the wafer W placed on the wafer placement surface 22 is desired to be promoted, the hollow part 64 may be set to a high thermal conductivity state, and when cooling of the wafer W placed on the wafer placement surface 22 is desired to be inhibited, the hollow part 64 may be set to a low thermal conductivity state. When the hollow part 64 is set to a low thermal conductivity state, the second adhesive layer 60 inhibits transfer of heat between the thermal diffusion plate 30 and the cooling plate 50, as compared to when the hollow part 64 is set to a high thermal conductivity state. Thus, when the hollow part 64 is set to a high thermal conductivity state, cooling of the wafer W by the refrigerant can be promoted, and when the hollow part 64 is set to a low thermal conductivity state, cooling of the wafer W by the refrigerant can be inhibited.

Note that the present invention is not limited to the above-described embodiment at all, and it is needless to say that the present invention can be carried out in various forms as long as the forms belong to the technical scope of the present invention.

Figure 6:
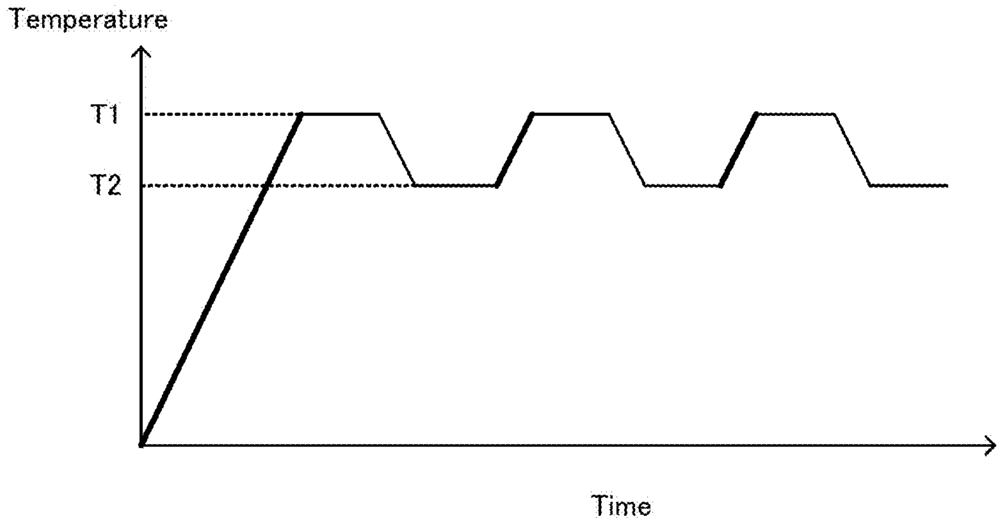
FIG. 6 is a graph showing a relationship between time and temperature of wafer W in a process of treating the wafer W.

In the above-described embodiment, an example has been illustrated in which it is determined according to ON/OFF of plasma whether a heat transfer gas is sealed or a vacuum atmosphere is created in the hollow part 64, but the embodiment is not limited to this particular example. For example, in a process of treating the wafer W, rise and fall of the temperature of the wafer W is repeatedly performed, and at a timing of temperature rise, a vacuum atmosphere may be created in the hollow part 64. FIG. 6 is a graph showing a relationship between time and temperature of the wafer W in a process of treating the wafer W. In this case, at the start time of the process, the hollow part 64 is set to a vacuum atmosphere, the hollow part 64 is maintained at a vacuum atmosphere until the temperature of the wafer W rises to T1, and when the temperature of the wafer W reaches T1, a heat transfer gas is supplied and sealed in the hollow part 64. After the temperature of the wafer W is maintained at T1 for a predetermined time, the temperature is allowed to falls to T2 (<T1), and subsequently, the hollow part 64 with a heat transfer gas sealed therein is maintained in a period in which the temperature is maintained at T2 for a predetermined time. Subsequently, the hollow part 64 is set to a vacuum atmosphere, and the hollow part 64 is maintained at a vacuum atmosphere until the temperature of the wafer W rises from T2 to T1. In the bold line portion (temperature rise interval) of the line graph in FIG. 6, the hollow part 64 is set to a vacuum atmosphere. In this setting, when the wafer W is raised in temperature, heat removal from the refrigerant flow path 52 is unlikely occur, thus the wafer W can be raised in temperature quickly.

Figure 7:
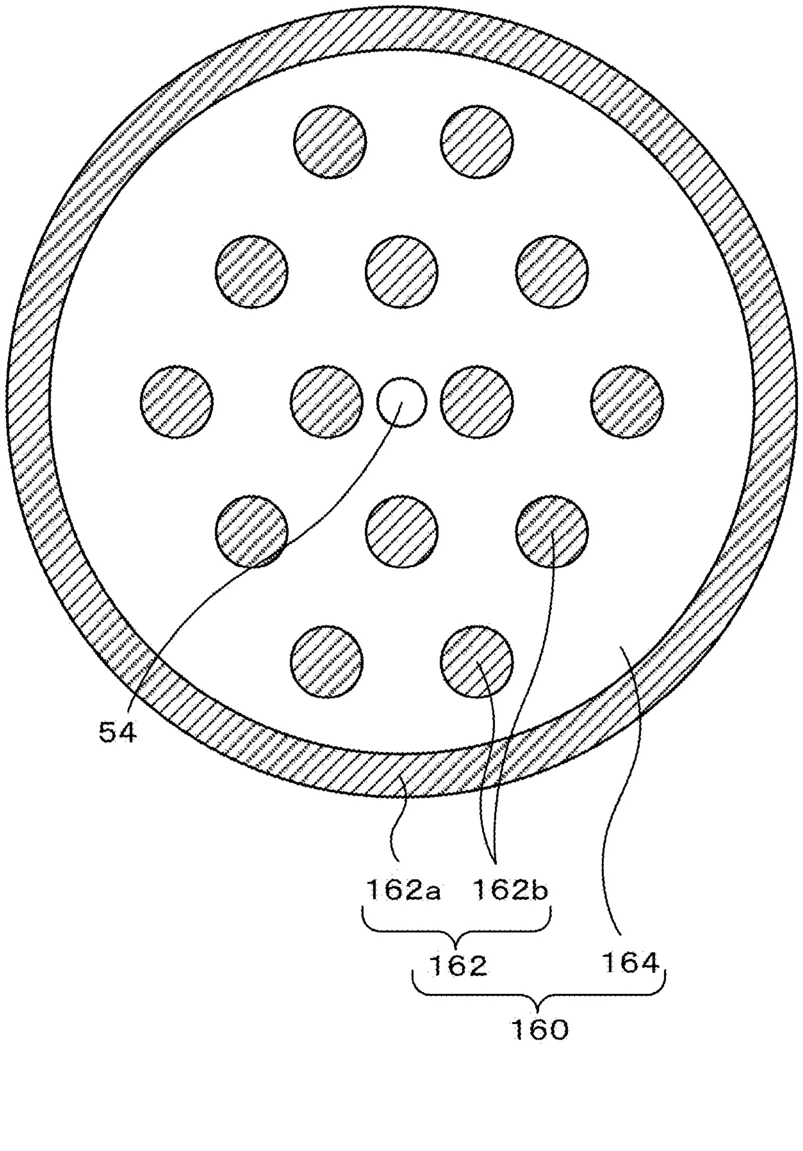
FIG. 7 is a top view of a cross sectional view when a second adhesive layer 160 is cut horizontally.

In the above-described embodiment, of the second adhesive layer 60, the swirl passage serves as the hollow part 64, and the portion other than the swirl passage serves as the adhesive part 62; however, the second adhesive layer is not limited to this. For example, as the hollow part 64, a zigzag passage may be used instead of a swirl passage. Alternatively, as in a second adhesive layer 160 illustrated in FIG. 7, an adhesive part 162 may be constituted by an annular adhesive part **162*a* having the same outer diameter as the diameter of the thermal diffusion plate 30, and a plurality of circular adhesive parts 162*b* scattered in the inner region of the annular adhesive part 162*a*, and the hollow part 164 may be the portion of the inner region of the annular adhesive part 162*a*, excluding the plurality of circular adhesive parts 162*b*. However, in consideration of ease of manufacturing, the second adhesive layer 60 in FIG. 3** is preferable.

In the above-described embodiment, gas can be supplied to the hollow part 64; however, instead of gas, liquid may be supplied to the hollow part 64. As liquid, for example, the same one as the refrigerant which is passed through the refrigerant flow path 52 can be used.

In the above-described embodiment, the thermal conductivity of the hollow part 64 with a heat transfer gas sealed therein may be the same as the thermal conductivity of the first adhesive layer 40, or may be higher than the thermal conductivity of the first adhesive layer 40, or may be lower than the thermal conductivity of the first adhesive layer 40.

In the above-described embodiment, the cooling plate 50 is provided with one communication path 54, but the embodiment is not limited to this. For example, two communication paths 54 which communicate with the hollow part 64 may be provided from the lower surface of the cooling plate 50, where one communication path may serve as an inlet, and the other may serve as an outlet.

In the above-described embodiment, the first adhesive layer 40 and the second adhesive layer 60 are resin adhesive layers; however, one or both of the first adhesive layer 40 and the second adhesive layer 60 may be metal bonding layers. A metal bonding layer is formed by e.g., welding, brazing bonding, diffusion bonding, or TCB (Thermal compression bonding). TCB is a publicly known method by which a metal bonding material is inserted between two members to be bonded, and the two members are pressurized and bonded with the two members heated at a temperature lower than or equal to the solidus temperature of the metal bonding material.

In the above-described embodiment, a circular disc member made of metal has been illustrated as the cooling plate 50, but the embodiment is not limited to this. For example, the cooling plate 50 may be a circular disc member comprised of a composite material of metal and ceramic. As the composite material of metal and ceramic, a metal matrix composite material (MMC) and a ceramic matrix composite material (CMC) may be mentioned. As a specific example of such a composite material, a material containing Si, SiC and Ti, a material obtained by impregnating a SiC porous body with Al and/or Si, and a composite material of $Al_2O_3$ and TiC may be mentioned.

In the above-described embodiment, the electrostatic electrode 24 and the heater electrode 26 each have been illustrated as the electrode built in the ceramic plate 20, but the embodiment is not limited to this. For example, the electrode built in the ceramic plate 20 may be one of the electrostatic electrode 24 or the heater electrode 26, or in addition to these electrodes 24, 26, an RF electrode to which a radio frequency voltage is applied may be built in.

In the above-described embodiment, a lift pin hole may be formed in the wafer placement table 10, the lift pin hole allowing a lift pin for lifting the wafer W from the wafer placement surface 22 to be inserted, or a gas hole for supplying back side gas may be formed in the rear surface of the wafer W.

In the above-described embodiment, the heater electrode 26 is provided in a region corresponding to substantially the entire upper surface of the ceramic plate 20; however, the region corresponding to substantially the entire upper surface of the ceramic plate 20 may be divided into a plurality of zones, and each zone may be provided with a heater electrode.

The present invention is applicable to apparatuses that perform plasma treatment on wafer, for example.

International Application No. PCT/JP2023/031260, filed on Aug. 29, 2023, is incorporated herein by reference in its entirety.

What is claimed is:

1. A wafer placement table comprising:

a ceramic plate having a wafer placement surface on its upper surface and a built-in electrode;

a thermal diffusion plate provided on a lower surface of the ceramic plate;

a first adhesive layer bonding the ceramic plate and the thermal diffusion plate together;

a cooling plate that is provided on a lower surface of the thermal diffusion plate, and internally includes a refrigerant flow path; and a second adhesive layer provided between the thermal diffusion plate and the cooling plate, and having an adhesive part and a hollow part, the adhesive part bonding the thermal diffusion plate and the cooling plate together, the hollow part being a gap provided between the thermal diffusion plate and the cooling plate; and wherein the cooling plate includes a communication path that communicates with the hollow part from a lower surface or a lateral surface of the cooling plate.

2. The wafer placement table according to claim 1, wherein a thickness of the thermal diffusion plate is greater than a thickness between a ceiling surface of the refrigerant flow path of the cooling plate and an upper surface of the cooling plate.

3. The wafer placement table according to claim 1, wherein a thermal conductivity of the thermal diffusion plate is higher than a thermal conductivity between a ceiling surface of the refrigerant flow path of the cooling plate and an upper surface of the cooling plate.

4. The wafer placement table according to claim 1, wherein a thickness of the first adhesive layer is less than a thickness of the second adhesive layer.

5. The wafer placement table according to claim 1, wherein a thermal resistance of the first adhesive layer in an up-down direction is lower than a thermal resistance of the adhesive part of the second adhesive layer in an up-down direction.

6. The wafer placement table according to claim 1, wherein a ratio of a bonding area of the adhesive part with respect to an entire area of the second adhesive layer in a plan view is 10% or greater and 50% or less.

7. The wafer placement table according to claim 1, wherein the hollow part is switchable between low and high thermal resistance states.

8. A method of using the wafer placement table according to claim 1, wherein when cooling of a wafer placed on the wafer placement surface is desired to be promoted, the hollow part is set to a high thermal conductivity state, and when cooling of the wafer placed on the wafer placement surface is desired to be inhibited, the hollow part is set to a low thermal conductivity state.

9. The method of using the wafer placement table according to claim 8, wherein when cooling of a wafer placed on the wafer placement surface is desired to be promoted, the hollow part is set to a high thermal conductivity state by filling the hollow part with a heat transfer gas, and when cooling of the wafer placed on the wafer placement surface is desired to be inhibited, the hollow part is set to a low thermal conductivity state by bringing the hollow part to a vacuum state.

10. A wafer placement table comprising:

a ceramic plate having a wafer placement surface on its upper surface and a built-in electrode;

a thermal diffusion plate provided on a lower surface of the ceramic plate;

a first adhesive layer bonding the ceramic plate and the thermal diffusion plate together;

a cooling plate that is provided on a lower surface of the thermal diffusion plate, and internally includes a refrigerant flow path; and a second adhesive layer provided between the thermal diffusion plate and the cooling plate, and having an adhesive part and a hollow part, the adhesive part bonding the thermal diffusion plate and the cooling plate together, the hollow part being a gap provided between the thermal diffusion plate and the cooling plate; and wherein the hollow part is switchable between low and high thermal resistance states.

11. The wafer placement table according to claim 10, wherein a thickness of the thermal diffusion plate is greater than a thickness between a ceiling surface of the refrigerant flow path of the cooling plate and an upper surface of the cooling plate.

12. The wafer placement table according to claim 10, wherein a thermal conductivity of the thermal diffusion plate is higher than a thermal conductivity between a ceiling surface of the refrigerant flow path of the cooling plate and an upper surface of the cooling plate.

13. The wafer placement table according to claim 10, wherein a thickness of the first adhesive layer is less than a thickness of the second adhesive layer.

14. The wafer placement table according to claim 10, wherein a thermal resistance of the first adhesive layer in an up-down direction is lower than a thermal resistance of the adhesive part of the second adhesive layer in an up-down direction.

15. The wafer placement table according to claim 10, wherein a ratio of a bonding area of the adhesive part with respect to an entire area of the second adhesive layer in a plan view is 10% or greater and 50% or less.

16. A method of using the wafer placement table according to claim 10, wherein when cooling of a wafer placed on the wafer placement surface is desired to be promoted, the hollow part is set to a high thermal conductivity state, and when cooling of the wafer placed on the wafer placement surface is desired to be inhibited, the hollow part is set to a low thermal conductivity state.

17. The method of using the wafer placement table according to claim 16, wherein when cooling of a wafer placed on the wafer placement surface is desired to be promoted, the hollow part is set to a high thermal conductivity state by filling the hollow part with a heat transfer gas, and when cooling of the wafer placed on the wafer placement surface is desired to be inhibited, the hollow part is set to a low thermal conductivity state by bringing the hollow part to a vacuum state.

* * * * *